(12) United States Patent
Chang et al.

(10) Patent No.: US 12,403,685 B2
(45) Date of Patent: Sep. 2, 2025

(54) PLATE COOLING DEVICE AND DE-BONDING STATION WITH PLATE COOLING DEVICE

(71) Applicant: SKY TECH INC., Hsinchu County (TW)

(72) Inventors: Jung-Hua Chang, Hsinchu County (TW); Ta-Hao Kuo, Hsinchu County (TW)

(73) Assignee: SKY TECH INC., Hsinchu (TW)

( * ) Notice: Subject to any disclaimer, the term of this patent is extended or adjusted under 35 U.S.C. 154(b) by 118 days.

(21) Appl. No.: 18/373,266

(22) Filed: Sep. 26, 2023

(65) Prior Publication Data

US 2025/0100267 A1    Mar. 27, 2025

(51) Int. Cl.
*B32B 43/00* (2006.01)

(52) U.S. Cl.
CPC ....... *B32B 43/006* (2013.01); *Y10T 156/1153* (2015.01); *Y10T 156/1911* (2015.01)

(58) Field of Classification Search
CPC ............. B32B 43/006; Y10T 156/1153; Y10T 156/1911
See application file for complete search history.

(56) References Cited

U.S. PATENT DOCUMENTS

| | | | |
|---|---|---|---|
| 2008/0053616 A1* | 3/2008 | Chen | B32B 38/18 156/367 |
| 2012/0224945 A1* | 9/2012 | Douki | H01L 21/6715 414/754 |
| 2017/0133243 A1* | 5/2017 | Thallner | H01L 21/68714 |
| 2020/0094522 A1* | 3/2020 | Otsuka | B41J 2/1628 |
| 2023/0162954 A1* | 5/2023 | Johanson | H01L 21/6833 361/234 |

* cited by examiner

*Primary Examiner* — Philip C Tucker
*Assistant Examiner* — Nickolas R Harm
(74) *Attorney, Agent, or Firm* — Chun-Ming Shih; HDLS IPR SERVICES

(57) ABSTRACT

A plate cooling device for cooling carrier plate of a wafer, includes a cooling plate and a plurality of contact pads. The cooling plate includes an upper surface; wherein the upper surface is provided with a cooling area for placing the wafer thereon. The contact pads are disposed on the upper surface. The contact pads protrude on the upper surface, and the total area of the contact pads is less than 3% of the area of the carrier plate.

9 Claims, 10 Drawing Sheets

PLATE COOLING DEVICE AND DE-BONDING STATION WITH PLATE COOLING DEVICE

BACKGROUND

Technical Field

This disclosure relates to a wafer thinning process, and in particular to a plate cooling device for cooling a carrier plate in a wafer stripping operation and a de-bonding station with the plate cooling device.

Related Art

The existing wafer fabrication process is moving towards the trend of thinning, but in the existing wafer thinning process, the gradual thinning of the wafer sheet has insufficient stress strength and is prone to breakage. Therefore, before thinning process, the wafer is bonded to a carrier plate, so as to enhance the mechanical strength of the wafer. And then wafer is then subjected to thinning operations such as chemical-mechanical grinding.

After the thinning process, the wafer and the carrier plate are heated, to reduce the strength of the adhesive, and then the carrier plate is stripped by a vacuum pickup device and placed on a cooling platform for cooling and recycling.

However, after the carrier plate is stripped from the wafer by the vacuum pickup device, the carrier plate faces the cooling platform with its bonding surface and the carrier plate has adhesive for being bonded to the wafer on the bonding surface. When the carrier plate is placed on the cooling platform, a large area of contact is made with the cooling platform by the bonding surface, so that the carrier plate is adhesively bonded to the cooling platform. When the carrier plate is transferred to other equipment after the cooling operation, the large area of adhesive creates a great adhesive force on the carrier plate, during the process of picking up and transferring the carrier plate, pickup failure may easily occur, causing the process of picking up and transferring the carrier plate to be interrupted, and the error must be eliminated manually. Meanwhile, If the adsorption force of the equipment is raised to forcefully remove the carrier plate from the cooling platform, the carrier plate will be prone to warping and deformation or rupture. Therefore, it is necessary to improve the way the carrier plate is placed on the cooling platform in order to avoid pickup failures during pickup and transfer of the carrier plate.

SUMMARY

In view of the above technical problems, this disclosure discloses a plate cooling device and a de-bonding station with plate cooling device, which can avoid errors when picking up and transferring a carrier plate from the plate cooling device.

This disclosure discloses a plate cooling device for cooling carrier plate of a wafer includes a cooling plate and a plurality of contact pads. The cooling plate includes an upper surface. The contact pads are disposed on the upper surface. The contact pads protrude on the upper surface, and the total area of the contact pads is less than 3% of the area of the carrier plate.

In one or more embodiments, the upper surface is provided with a cooling area the plurality of contact pads protrude on the upper surface.

In one or more embodiments, a front edge of the upper surface is provided with a notch.

In one or more embodiments, the upper surface is provided with at least one groove extending from the notch to a rear edge of the upper surface, and the plate cooling device further includes at least one fixing block, the at least one fixing block is provided in the groove; and the at least one fixing block is configured for a fixing member to pass through.

In one or more embodiments, the cooling plate further comprises two lateral recesses located on two opposite side edges of the upper surface, and the plate cooling device further comprises a plurality of the fixing blocks disposed on the two lateral recesses; and each of the fixing blocks is configured for a fixing member to pass through.

Based on the above-mentioned plate cooling device, this disclosure further discloses a de-bonding station for stripping a wafer from a carrier plate, and includes a base, a carrier device, the above-mentioned plate cooling device, and a carrier plate pickup device. The base is provided with two guiding pieces on two opposite edge sides. The carrier device is disposed on the base and located between the two guiding pieces. The carrier device includes a holder, a vacuum chuck, and a plurality of lifting pins. The holder is configured for the wafer and the carrier plate to be placed thereon, and the wafer faces the holder. A de-bonding section is provided on a top surface of the holder for placing the wafer and the carrier plate, and carrier plate is located above the wafer. The vacuum chuck is provided in the de-bonding section for vacuum absorbing the wafer. The lifting pins are disposed in the de-bonding section in a rising and lowering manner, and able to lower and fully embedded in the holder, or rise to push up or accept the wafer; The plate cooling device is disposed on the base and located between the two guiding pieces. The carrier plate pickup device includes a movable seat and a pickup head; wherein the movable seat is movably coupled to the two guiding pieces; and the pickup head is movably disposed on the horizontal beam for vacuum adsorbing the carrier plate, so as to strip the carrier plate from the wafer and move the carrier plate to the cooling area of the plate cooling device.

In one or more embodiments, each of the two guiding pieces is provided with a guiding slot, the movable seat comprises two pillars and a horizontal beam connecting the two pillars, the two pillars are inserted into each of the guiding slots, such that the movable seat is movably coupled to the two guiding pieces, and the pickup head is movably disposed on the horizontal beam.

In one or more embodiments, the de-bonding station further includes a first linear actuator and a second linear actuator; wherein the first linear actuator is disposed on the base and connected to one of the two pillars, the first linear actuator is configured to drive the two pillars to move along the two guiding slots; and the pickup head is connected to the horizontal beam via the second linear actuator, the second linear actuator is configured to drive the pickup head to move toward or away from the base.

In one or more embodiments, the de-bonding section is a shallow concave.

In one or more embodiments, a heater is embedded in the carrier plate to heat the wafer and the carrier plate placed in the de-bonding section.

Through the plate cooling device and the de-bonding station with plate cooling device according to this disclosure, the adhesive force generated by the adhesive on the bottom surface of the carrier plate will not be too large, which prevents pickup failure of the carrier plate during the subsequent transfer of the carrier plate, reduces the error rate of the de-bonding process, and effectively improves the production rate.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
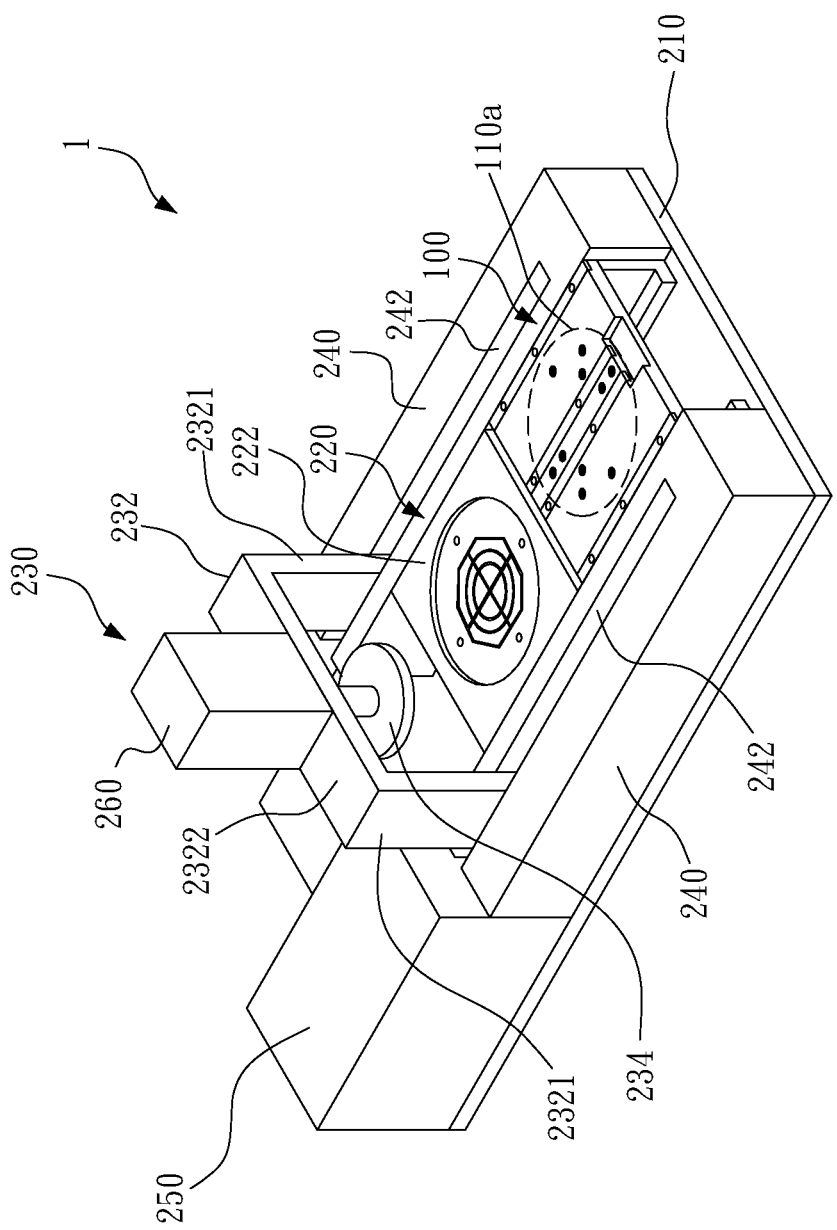
FIG. 1 is a perspective view of a de-bonding station with a plate cooling device according to an embodiment of this disclosure.
Figure 3:
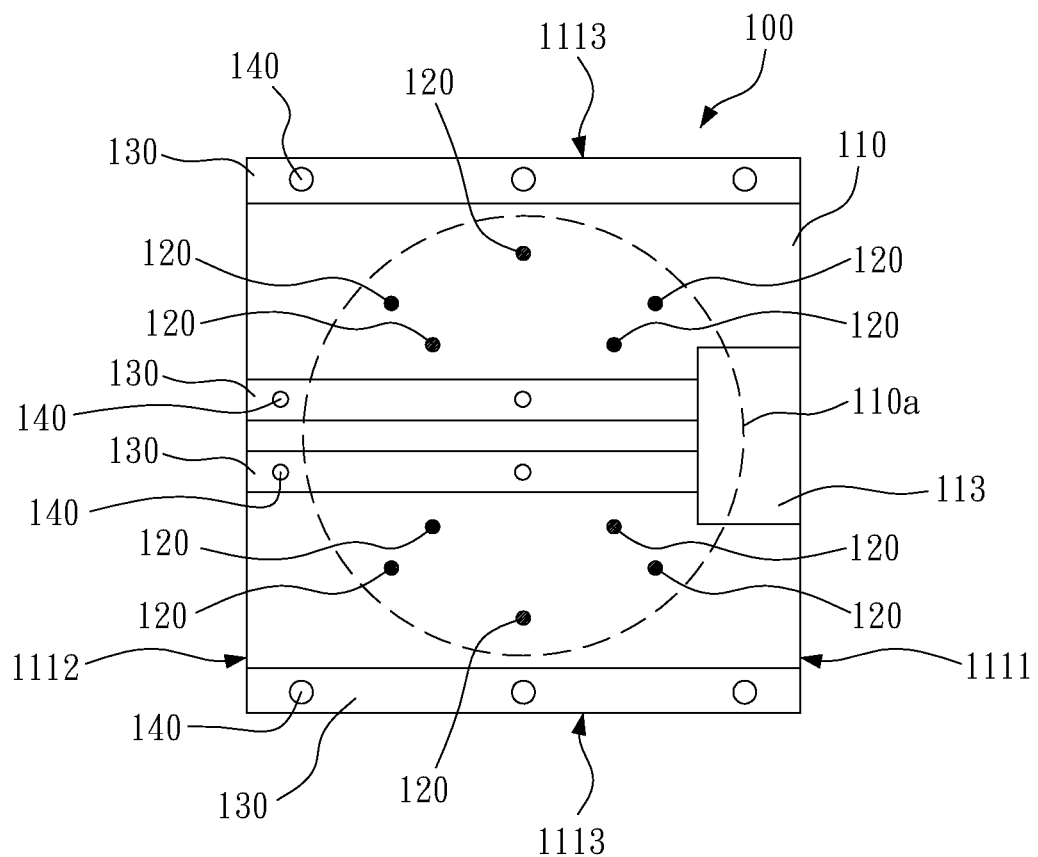
FIG. 3 is a top view of the plate cooling device according to the embodiment of this disclosure.

Referring to FIG. 1 and FIG. 3, this disclosure discloses a plate cooling device 100 and a de-bonding station 1 with plate cooling device 100.

Figure 2:
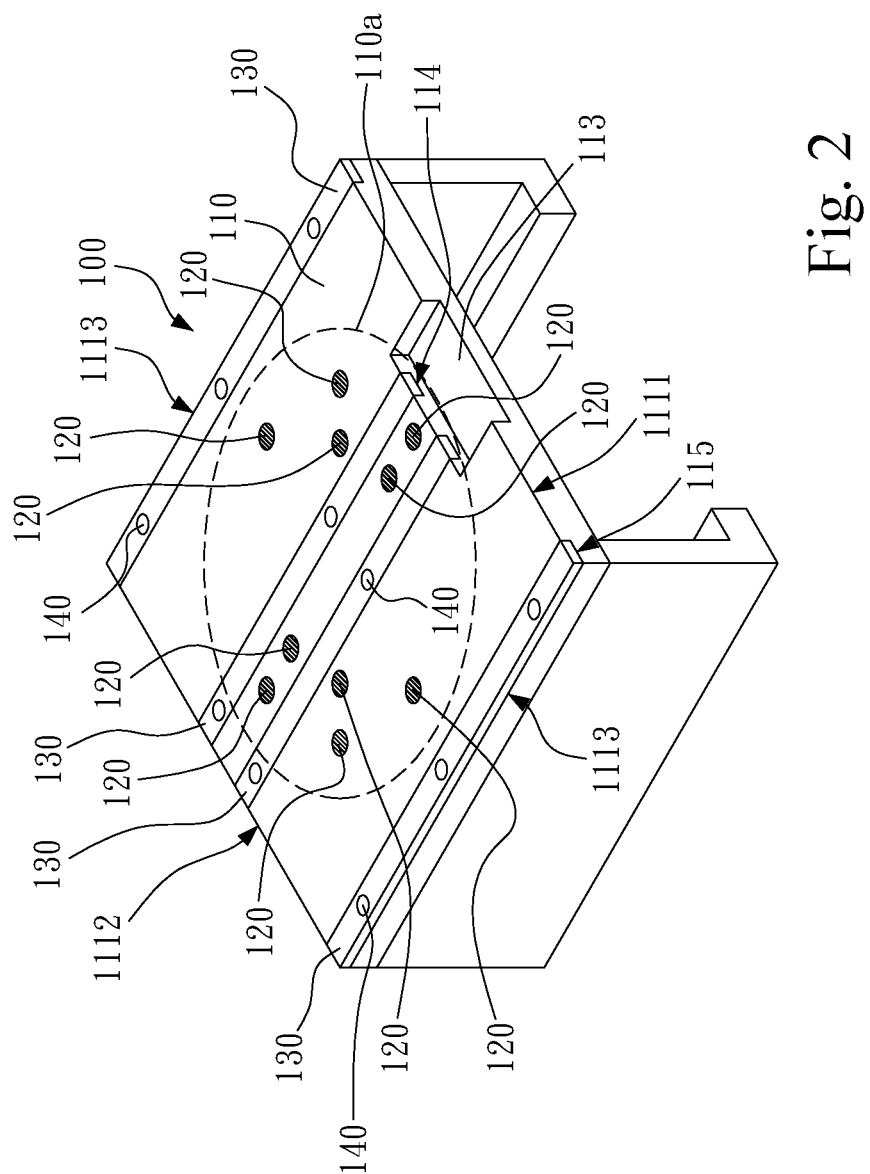
FIG. 2 is a perspective view of the plate cooling device according to the embodiment of this disclosure.

As shown in FIG. 2 and FIG. 3, the plate cooling device 100 includes a cooling plate 110 and a plurality of contact pads 120, the cooling plate 110 includes an upper surface 111. The upper surface 111 is provided with a cooling area 110a. The cooling area 110a is substantially circular with a diameter slightly larger or equal to the diameter of the carrier plate 4 to be cooled. Specifically, the cooling area 110a may be an area defined by a solid structure, such as a recess, or the cooling area 110a may be a virtual area for setting the position of the pickup device/robot for picking up/placing the carrier plate 4, i.e., the cooling area 110a is an area defined only in the control codes of the pickup device/robot.

As shown in FIG. 2 and FIG. 3, The contact pads 120 are disposed on the upper surface 111, and are located in the cooling area 110a. The contact pads 120 protrude on the upper surface 111 and located within the cooling area 110a.

Figure 4:
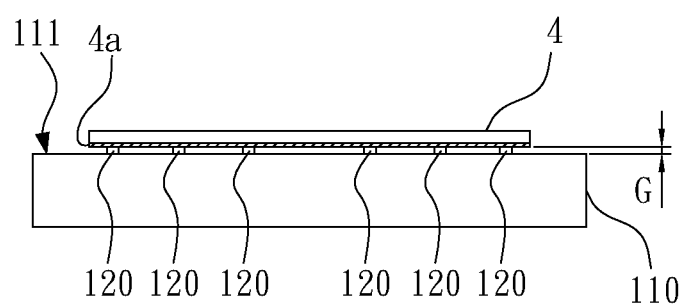
FIG. 4 is a lateral view of the carrier device according to the embodiment of this disclosure.
Figure 5:
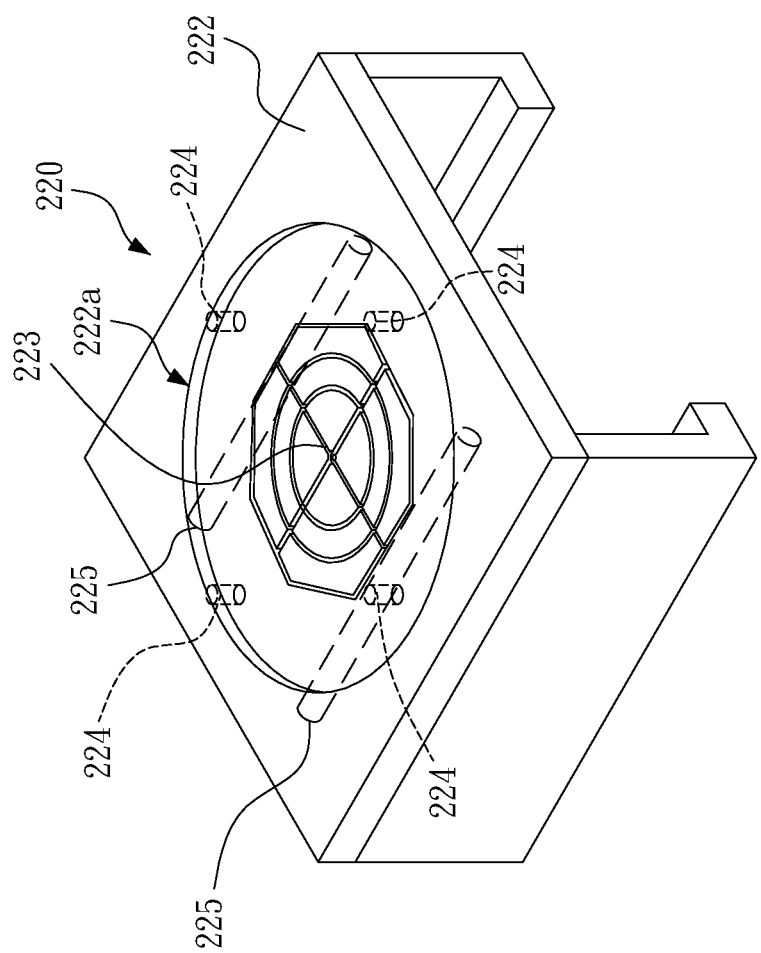
FIG. 5 is a perspective view of the carrier device according to the embodiment of this disclosure.

As shown in FIG. 3, FIG. 4 and FIG. 5, The contact pads 120 are configured for the carrier plate 4 to be cooled to be placed on, and through the support of the contact pad 120, a gap G is maintained between the carrier plate 4 and the upper surface 111. That is, the carrier plate 4 is in contact only with the contact pads 120, and the total area of contact between the carrier plate 4 and the contact pads 120 is much smaller than the area of the carrier plate 4 projected on the upper surface 111.

As shown in FIG. 4, the carrier plate 4 is in contact only with the contact pads 120, and there is only a small area of contact between the bottom surface of the carrier plate 4 and the contact pads 120. Therefore, the adhesive 4a on the bottom surface of the carrier plate 4 can only be applied to a small area, the normal adhesive force (the adhesive force in the direction normal to the upper surface 111) is significantly reduced.

The aforementioned adhesive force can still temporarily fix the carrier plate 4 in the cooling area 110, to prevent the carrier plate 4 from sliding on the upper surface 111. Cooling devices can be installed inside or outside the cooling plate 110. For example, a liquid cooling device that liquid cools the cooling plate 110 or an air-cooling device that provides a cooling airflow to the upper surface 111 to cool the carrier plate 4 directly.

As shown in FIG. 3, in detail, the total area of the contact pads 120 is less than 3% of the area of the carrier plate 4, such that the normal adhesive force (the adhesive force in the direction normal to the upper surface 111) between the contact pads 120 and the carrier plate 4 will not be too large, so as to prevent the carrier plate pickup device 230 from being unable to pick up and move the cooled carrier plate 4 from the contact pads 120. The configuration of the plurality of contact pads 120 may be distributed in a radial pattern from the center of the cooling area 110a outwardly, and uniformly distributed in the cooling area 110a. Therefore, the adhesive force is applied evenly to the bottom surface of the carrier plate 4, constituting a uniformly distributed point adhering instead of one large area adhering.

As shown in FIG. 2 and FIG. 3, in an example, a front edge 1111 of the upper surface 111 is provided with a notch 113, the upper surface 111 is provided with one or more trenches 114. Each of the trenches 114 extends from the notch 113 to a rear edge 1112 of the upper surface 111. In addition, in one embodiment, the cooling plate 110 further includes two lateral recesses 115 located on two opposite side edges 113 of the upper surface 111.

As shown in FIG. 2 and FIG. 3, and the plate cooling device 100 further includes a plurality of the fixing blocks 130, respectively disposed to the trenches 114 and the lateral recesses 115. The fixing block 130 is configured for a fixing member (such as a screw) to pass through, so as to fix the cooling plate 110 to the de-bonding station 1 or another base.

As shown in FIG. 1, the de-bonding station 1 includes a base 210, a carrier device 220, the plate cooling device 100, and a carrier plate pickup device 230.

As shown in FIG. 1, The base 210 is provided with two guiding pieces 240 on two opposite edge sides 1113. Each of the two guiding pieces 240 is provided with a guiding slot 242. The carrier device 220 is disposed on the base 210 and located between the two guiding pieces 240.

As illustrated in FIG. 1 and FIG. 4, The carrier device 220 includes a holder 222, a vacuum chuck 113 and a plurality of lifting pins 224. The holder 222 is configured for placing the wafer 3 to be stripped and its carrier plate 4 thereon. A de-bonding section 222a is provided on a top surface of the holder 222, and the de-bonding section 222a is a shallow concave. When the wafer 3 and the carrier plate 4 thereof are placed into the de-bonding section 222a, the wafer 3 is placed toward the de-bonding section 222a, so that the carrier plate 4 is positioned above the wafer 3. A heater 225, such as an electric heat pipe, may also be embedded in the holder 222, so as to heat the wafer 3 and the carrier plate 4 placed in the de-bonding section 222a. The heater 225 is not excluded from being provided outside the holder 222 for heating the carrier plate 4 directly.

As shown in FIG. 4, The vacuum chuck 223 and the lifting pins 224 are disposed within the de-bonding section 222a. The vacuum chuck 223 may include a vacuum adsorption orifice connected to a vacuum pimp and an air-conducting groove connected to the vacuum adsorption orifice. The vacuum chuck 223 is configured to generate a negative pressure to adsorb the wafer 3. The lifting pins 224 are disposed in the de-bonding section 222a in a rising and lowering manner, and able to lower and fully embedded in the holder 222, or rise to push up or accept the wafer 3.

As shown in FIG. 1, the plate cooling device 100 is disposed on the base 210 and located between the two guiding pieces 240. The plate cooling device 100 is adjacent to the carrier device 220.

As shown in FIG. 1, the carrier plate pickup device 230 includes a movable seat 232 and a pickup head 234. The movable seat 232 includes two pillars 2321 and a horizontal beam 2322 connecting the two pillars 2321. The two pillars 2321 are inserted into each of the guiding slots 242, such that the movable seat 232 is movably coupled to the two guiding pieces 240, and the movable seat is able to move in a longitudinal direction relative to the base 210. Meanwhile, the de-bonding station 1 includes first linear actuator disposed on the base 210 and connected to the movable seat 232, particularly connected to one of the two pillars 2321.

As shown in FIG. 1, the pickup head 234 is movably disposed on horizontal beam 2322 of the movable seat 232, and the pickup head 234 is connected to the horizontal beam 2322 via a second linear actuator 260. The pickup head 234 is configured for vacuum adsorbing the carrier plate 4, the second linear drive 260 is configured to drive the pickup head 234 forward (down) toward the base 210 or away (up) from the base 210. Meanwhile, through the first linear actuator 250 driving the two pillars 2321 to move along the guiding slots 242, the pickup head 234 is driven to move along the longitudinal direction.

Figure 6:
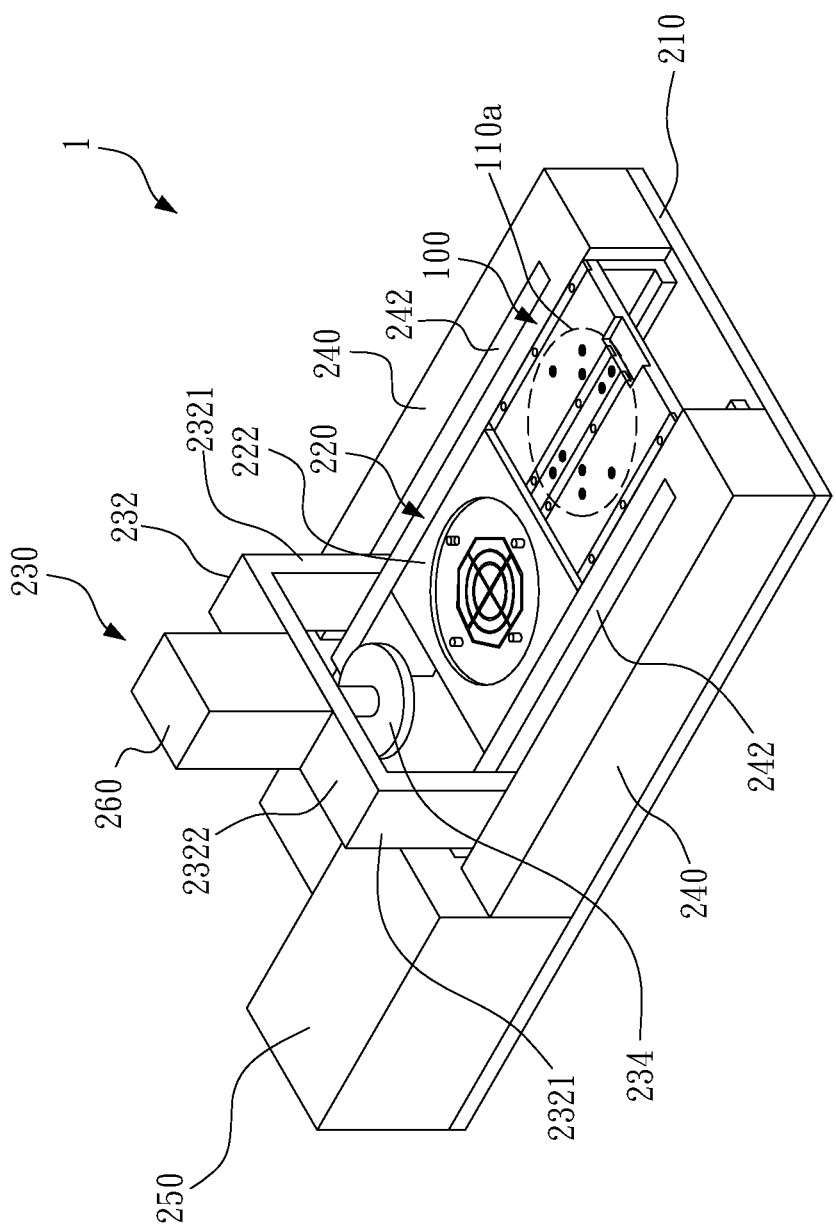
FIG. 6 to FIG. 11 are perspective views of the de-bonding station according to the embodiment of this disclosure, showing the stripping and cooling processes of the carrier plate.

Referring to FIG. 6, which shows the de-bonding process of the carrier plate 4. The wafer 3 is first temporarily adhered (bonded) to the carrier plate 4. The carrier plate 4 may be, but is not limited to, a glass substrate. The carrier plate 4 is used to reinforce the mechanical strength of the wafer 3 by the backside of the wafer 3. The wafer 3 is then placed in a thinning device to grind the surface of the wafer 3 by means of chemical-mechanical grinding, etc., to reduce the thickness of the wafer 3 and to flatten the surface of the wafer 3. The carrier plate 4 increases mechanical strength and prevents warpage of the wafer 3 during the thinning process.

Figure 7:
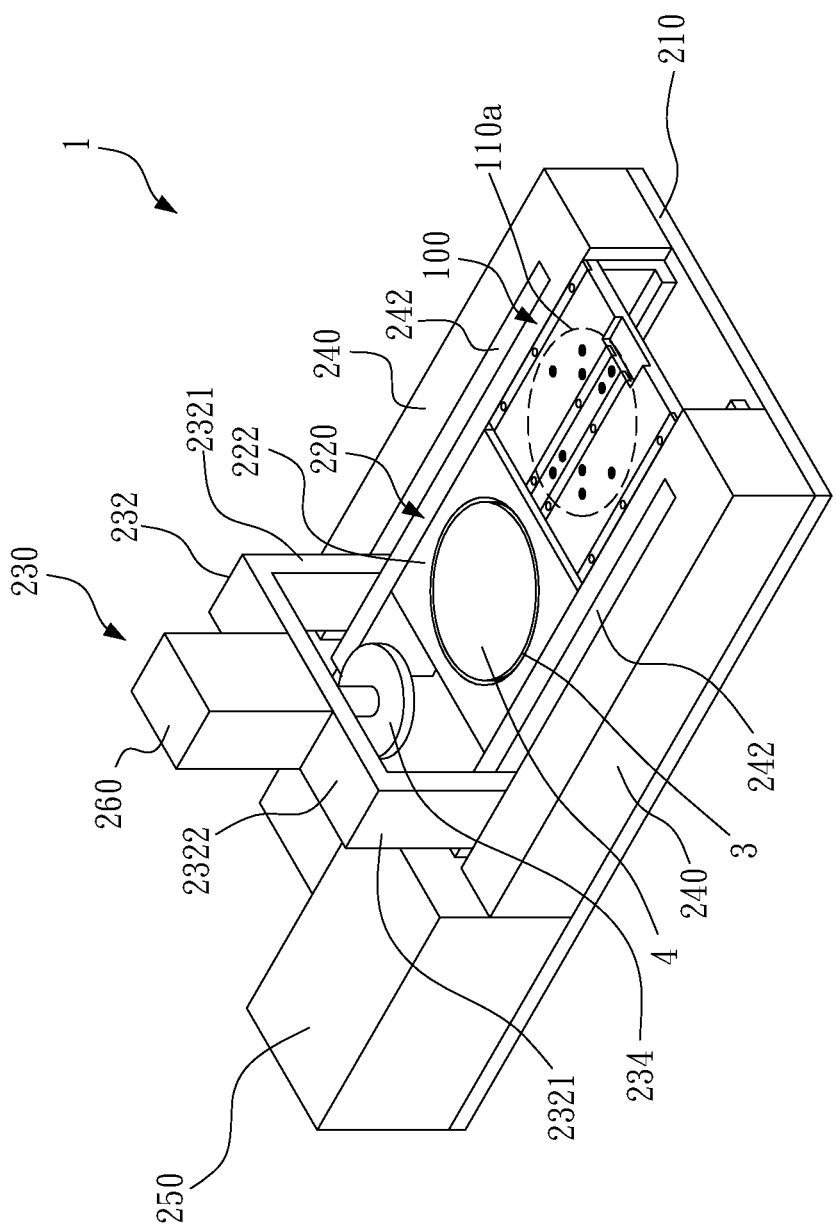

As shown in FIG. 6 and FIG. 7, The lifting pins 224 of the carrier device 220 first rise to protrude on the de-bonding section 222a, the wafer 3 to be stripped and its carrier plate 4 are moved by a robotic arm or other transportation equipment and placed on the lifting pins 224. And the wafer 3 faces the de-bonding section 222a with the carrier plate 4 located above the wafer 3.

Figure 8:
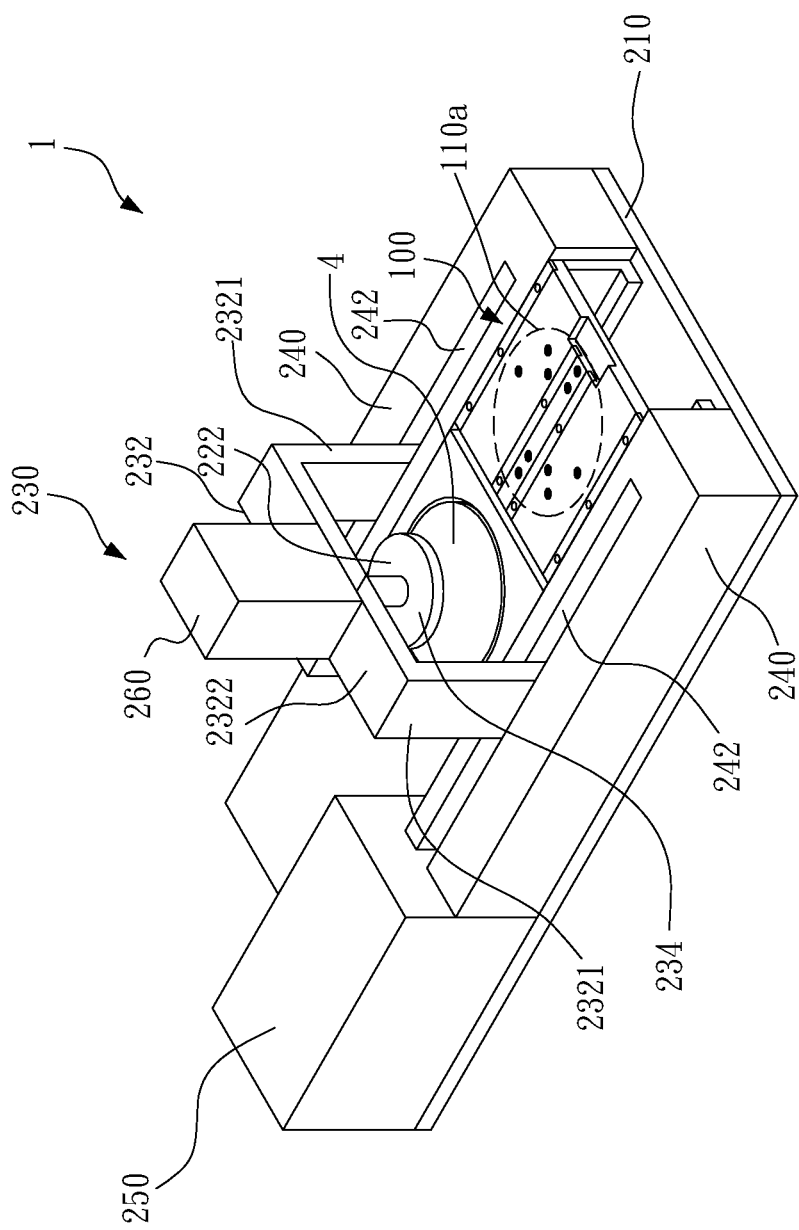

As shown in FIG. 8, next, the lifting pins 224 lower to be fully embedded in the holder 222, so as to place the wafer 3 to be stripped with the carrier plate 4 in the de-bonding section 222a. The vacuum chuck 223 starts to generate a negative pressure to adsorb/fix the wafer 3, and the heater 225 starts to heat the wafer 3 and the carrier plate 4 to weaken adhesive/bonding structure, for example, softening of adhesive between the wafer 3 and the carrier plate 4.

Figure 9:
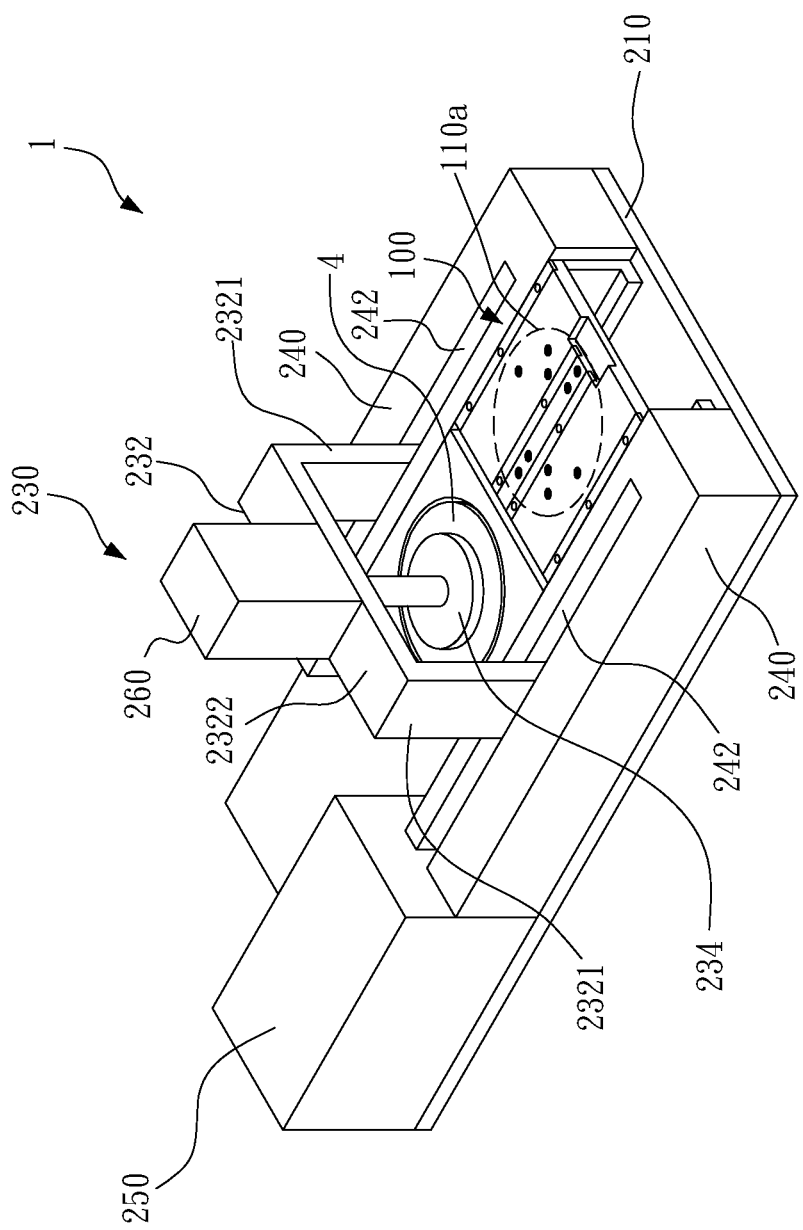
Figure 10:
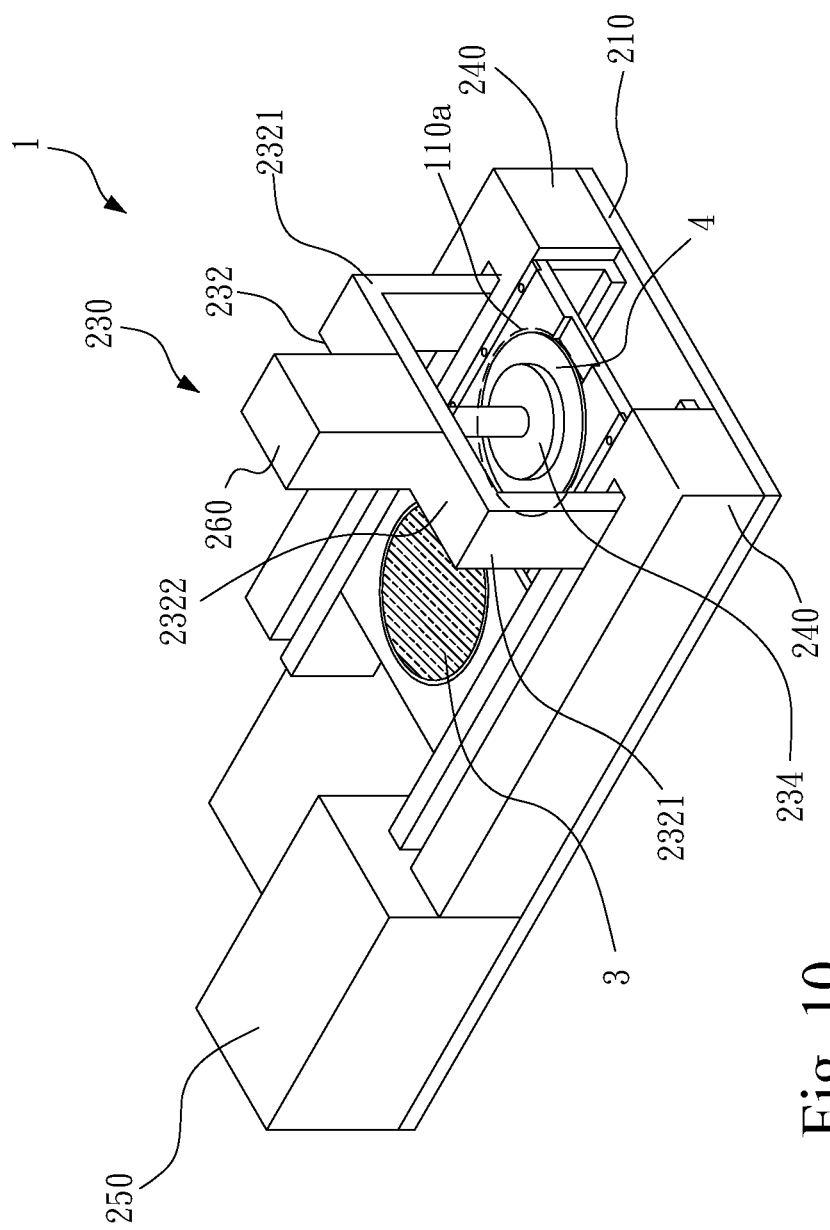

As shown in FIG. 9 and FIG. 10, the second linear actuator 260 drives the pickup head 234 to lower down to contact the carrier plate 4, and the pickup head vacuum adsorbs the carrier plate 4. The second linear actuator 260 drives the pickup head 234 to rise to strip the carrier plate 4 from the wafer 3.

As shown in FIG. 9 and FIG. 10, the first linear actuator 250 drives the two pillars 2321 to move along the guiding slots 242, to move the pickup head 234 and the carrier plate 4 to the plate cooling device 100, so as to place the carrier plate 4 on the cooling area 110a. Through the small area of contact provided by the contact pads 120, The adhesive force generated by the adhesive 4a on the bottom surface of the carrier plate 4 temporarily holds the carrier plate 4 in place in the cooling area 110a without horizontal movement.

Figure 11:
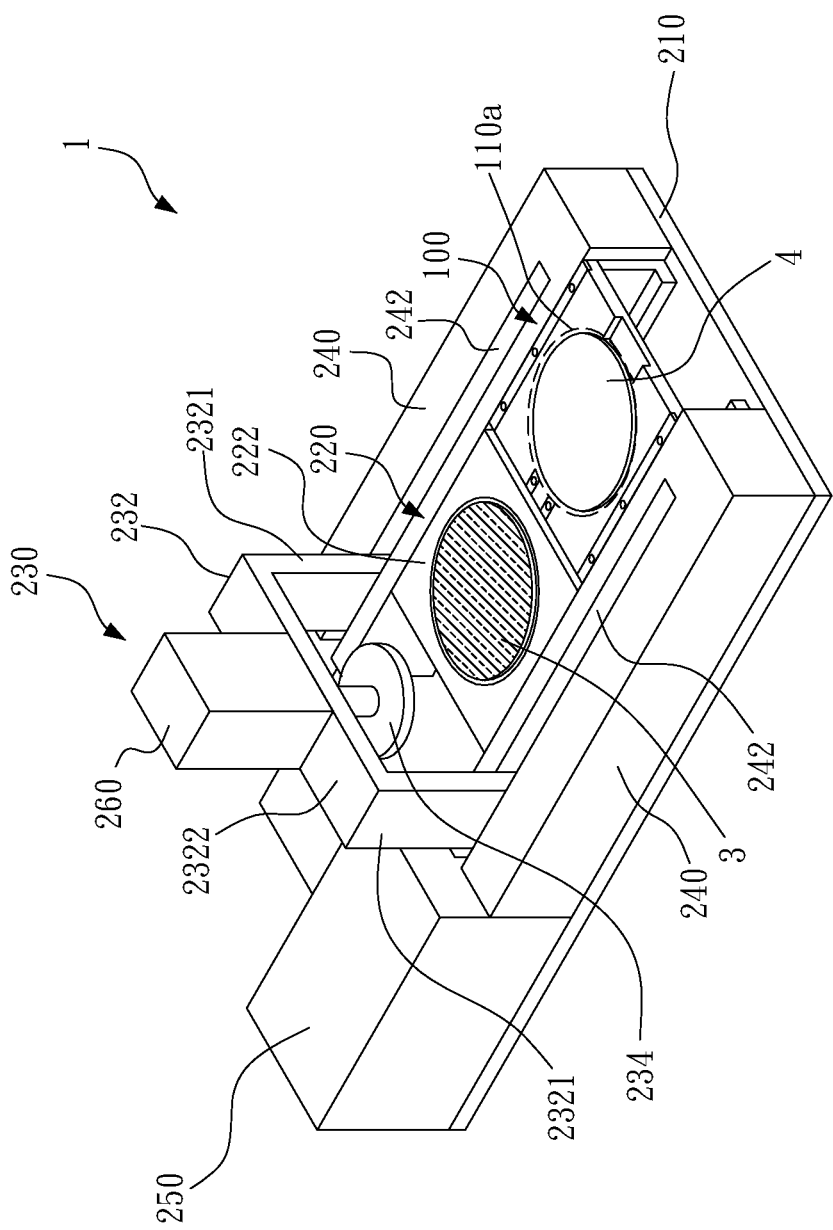

As shown in FIG. 11, at the time, B\by means of a cooling device located inside or outside the cooling plate 110, such as a liquid cooling device that liquid cools the cooling plate 110, or an air-cooling device that provides a cooling airflow to the upper surface 111, the carrier plate 4 is cooled.

The cooled carrier plate 4 can be picked up by a robotic arm or other pickup device and moved to a transfer tray. Similarly, the wafer 3 in the de-bonding section 222a can be picked up by a robotic arm or other pickup device and moved to other transfer tray. As described above, the total area of the contact pads 120 is less than 3% of the area of the carrier plate 4, Through the small area of contact provided by the contact pads 120, the normal adhesive force (the adhesive force in the direction normal to the upper surface 111) between the contact pads 120 and the carrier plate 4 will not be too large, the pickup head 234 can easily pick up the carrier plate 4 without causing pickup failure or causing damage to the carrier plate 4. The adhesion between the carrier substrate 4 and the contact pad 120 still provides sufficient shear direction adhesive force, to prevent the carrier plate 4 from moving horizontally on the cooling plate 110.

Through the plate cooling device 100 and the de-bonding station 1 with plate cooling device 100 according to this disclosure, the normal adhesive force between the contact pads 120 and the carrier plate 4 will not be too large, which prevents pickup failure of the carrier plate 4 during the subsequent transfer of the carrier plate 4, reduces the error rate of the de-bonding process, and effectively improves the production rate.

What is claimed is:

1. A de-bonding station, for stripping a wafer from a carrier plate, comprising:
   a base with two guiding pieces on two opposite edge sides;
   a carrier device disposed on the base and located between the two guiding pieces; wherein the carrier device comprises:
   a holder for the wafer and the carrier plate to be placed thereon; wherein a de-bonding section is provided on a top surface of the holder for placing the wafer and the carrier plate, and carrier plate is located above the wafer,
   a vacuum chuck provided in the de-bonding section for vacuum absorbing the wafer;
   a plurality of lifting pins, disposed in the de-bonding section in a rising and lowering manner, and able to lower and fully embed in the holder, or rise to push up or accept the wafer;
   a plate cooling device, disposed on the base, and located between the two guiding pieces, comprising:
   a cooling plate including an upper surface; and
   a plurality of contact pads disposed on the upper surface; wherein the contact pads protrude on the upper surface, and the total area of the contact pads is less than 3% of the area of the carrier plate projected on the upper surface; and
   a carrier plate pickup device comprising a movable seat and a pickup head; wherein the movable seat is movably coupled to the two guiding pieces; the pickup head is movably disposed on the movable seat for vacuum adsorbing the carrier plate, so as to strip the carrier plate from the wafer and move the carrier plate to a cooling area of the plate cooling device.

2. The de-bonding station as claimed in claim 1, wherein the upper surface is provided with a cooling area the plurality of contact pads protrude on the upper surface.

3. The de-bonding station as claimed in claim 1, wherein a front edge of the upper surface is provided with a notch.

4. The de-bonding station as claimed in claim 3, wherein the upper surface is provided with at least one groove extending from the notch to a rear edge of the upper surface, and the plate cooling device further includes at least one fixing block, the at least one fixing block is provided in the at least one groove; and the at least one fixing block is configured for a fixing member to pass through.

5. The de-bonding station as claimed in claim 1, wherein the cooling plate further comprises two lateral recesses located on two opposite side edges of the upper surface, and the plate cooling device further comprises a plurality of fixing blocks disposed on the two lateral recesses; and each of the fixing blocks is configured for a fixing member to pass through.

6. The de-bonding station as claimed in claim 1, wherein each of the two guiding pieces is provided with a guiding slot, the movable seat comprises two pillars and a horizontal beam connecting the two pillars, the two pillars are inserted into each of the guiding slots, such that the movable seat is movably coupled to the two guiding pieces, and the pickup head is movably disposed on the horizontal beam.

7. The de-bonding station as claimed in claim 6, further comprising: a first linear actuator and a second linear actuator; wherein the first linear actuator is disposed on the base and connected to one of the two pillars, the first linear actuator is configured to drive the two pillars to move along the two guiding slots; and the pickup head is connected to the horizontal beam via the second linear actuator, the second linear actuator is configured to drive the pickup head to move toward or away from the base.

8. The de-bonding station as claimed in claim 1, wherein the de-bonding section is a shallow concave.

9. The de-bonding station as claimed in claim 1, wherein a heater is embedded in the carrier plate to heat the wafer and the carrier plate placed in the de-bonding section.

\* \* \* \* \*